(12) United States Patent
Hui et al.

(10) Patent No.: US 6,781,248 B2
(45) Date of Patent: Aug. 24, 2004

(54) METHOD FOR ENCAPSULATING INTERMEDIATE CONDUCTIVE ELEMENTS CONNECTING A SEMICONDUCTOR DIE TO A SUBSTRATE AND SEMICONDUCTOR DEVICES SO PACKAGED

(75) Inventors: Chong Chin Hui, Singapore (SG); Lee Kian Chai, Singapore (SG); Jason Pittam, Morgan Hill, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 09/916,197

(22) Filed: Jul. 27, 2001

(65) Prior Publication Data

US 2002/0172024 A1 Nov. 21, 2002

(30) Foreign Application Priority Data

May 21, 2001 (SG) ..................................... 200103014-7

(51) Int. Cl.[7] .............................................. H01L 21/56
(52) U.S. Cl. ...................... 257/787; 257/704; 257/783; 438/118; 438/126
(58) Field of Search ................................ 257/783, 784, 257/787, 701–704; 438/118, 126, 127; 264/272.17; 361/767, 768, 783; 174/255, 260

(56) References Cited

U.S. PATENT DOCUMENTS

| 6,020,629 A | * | 2/2000 | Farnworth et al. | .......... 257/686 |
|---|---|---|---|---|
| 6,048,755 A | * | 4/2000 | Jiang et al. | .................. 438/118 |
| 6,087,203 A | * | 7/2000 | Eng et al. | .................... 438/118 |
| 6,091,140 A | * | 7/2000 | Toh et al. | .................... 257/691 |
| 6,144,102 A | * | 11/2000 | Amagai | ...................... 257/781 |
| 6,175,159 B1 | * | 1/2001 | Sasaki | ......................... 257/778 |
| 6,207,478 B1 | | 3/2001 | Chung et al. | ............... 438/124 |
| 6,218,731 B1 | * | 4/2001 | Huang et al. | ............... 257/738 |
| 6,429,372 B1 | * | 8/2002 | Taguchi et al. | ............ 174/52.4 |
| 6,476,507 B1 | * | 11/2002 | Takehara | .................... 257/787 |

OTHER PUBLICATIONS

Search Report, dated Dec. 18, 2001.

* cited by examiner

Primary Examiner—John B. Vigushin
(74) Attorney, Agent, or Firm—TraskBritt

(57) ABSTRACT

A method for packaging semiconductor device assemblies. An assembly is formed which includes a semiconductor die, a tape positioned over the active surface of the die, and a substrate element positioned on an opposite side of the tape from the die. Bond pads of the die are exposed through a slot formed through the tape and an aligned opening formed through the substrate element facilitate the extension of intermediate conductive elements from the bond pads and through the slot and opening, to corresponding contact areas on the substrate element. One or both ends of the slot extend beyond an outer periphery of the die to facilitate introduction of an encapsulant material into a channel or receptacles defined by the slot, opening, and active surface of the semiconductor die. Prior to encapsulation, the side of the opening of the substrate element is sealed opposite the tape with a coverlay to contain the encapsulant material within the channel or receptacle. Assemblies and packages formed by the method are also disclosed.

113 Claims, 5 Drawing Sheets

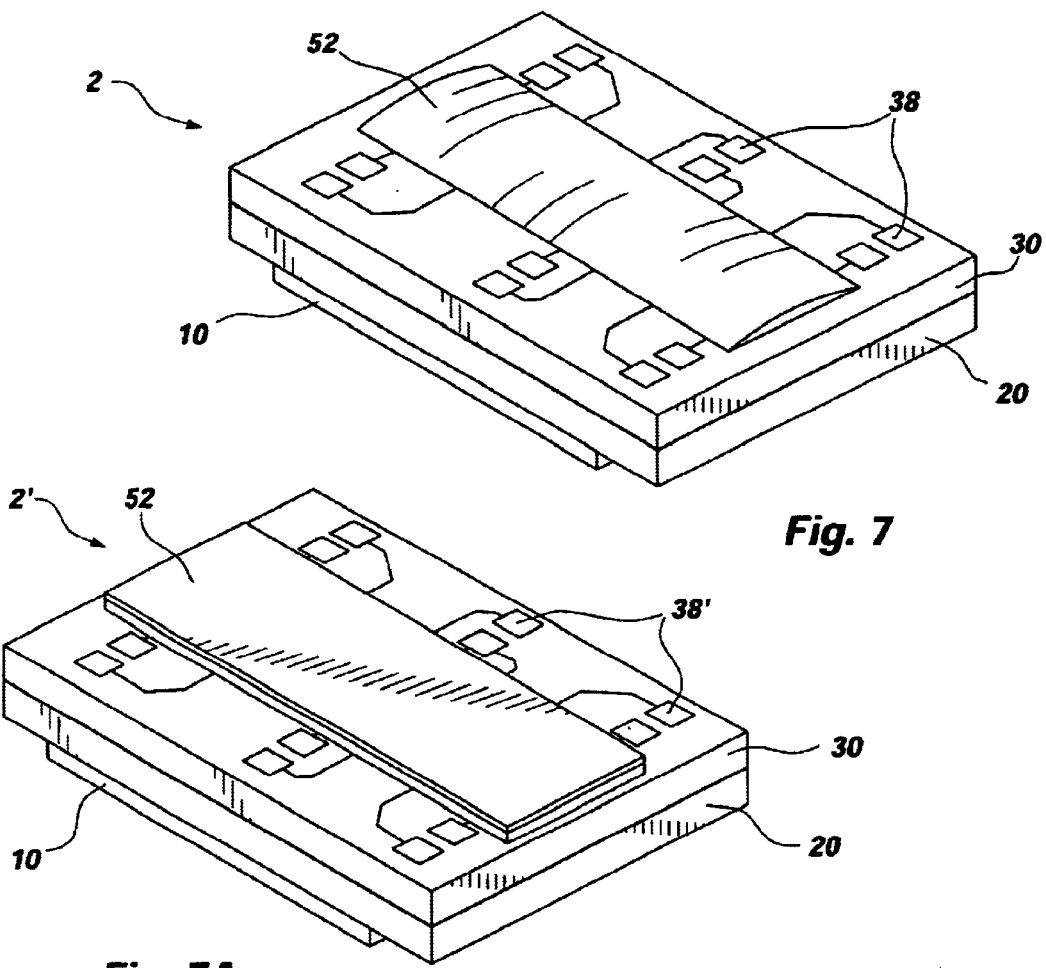
Fig. 7
Fig. 7A
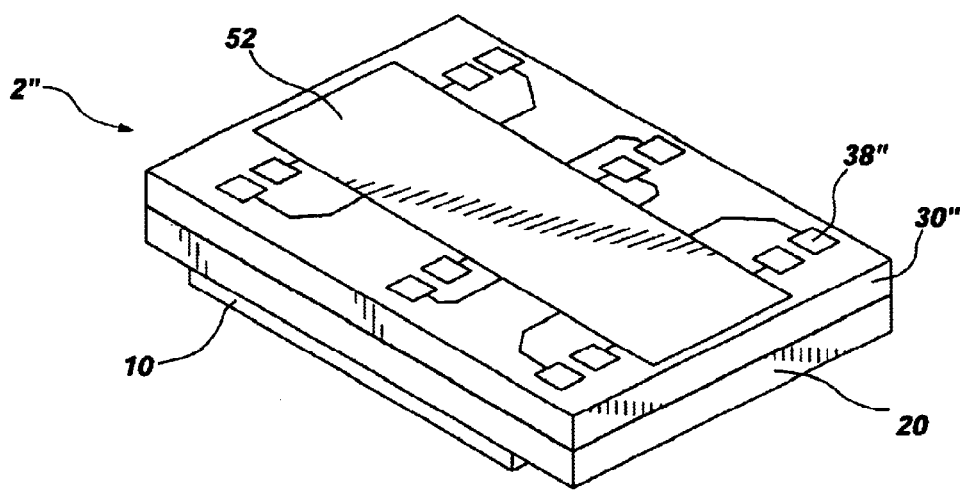
Fig. 7B

METHOD FOR ENCAPSULATING INTERMEDIATE CONDUCTIVE ELEMENTS CONNECTING A SEMICONDUCTOR DIE TO A SUBSTRATE AND SEMICONDUCTOR DEVICES SO PACKAGED

BACKGROUND

1. Field of the Invention

The present invention relates generally to methods for packaging an assembly including a semiconductor die and a substrate element, such as an interposer or a carrier substrate and, more specifically, to a method for introducing an encapsulant material over intermediate conductive elements electronically connecting a semiconductor die and a substrate element. Particularly, the method of the present invention includes disposing tape between the semiconductor die and the substrate element, the intermediate conductive elements being located within a slot formed in the tape, and introducing encapsulant material into the slot.

2. Background of the Related Art

The dimensions of many different types of state of the art electronic devices are ever decreasing. To reduce the dimensions of electronic devices, the way in which the microprocessors, memory devices, other semiconductor devices, and other electronic componentry of these devices are packaged and assembled with circuit boards must become more compact.

One approach to reducing the sizes of assemblies of semiconductor devices and circuit boards has been to reduce the profiles of semiconductor devices and other electronic components upon carrier substrates (e.g., circuit boards) by reducing the distances the semiconductor devices or other electronic components protrude from the carrier substrates. Various types of packaging technologies have been developed to facilitate orientation of semiconductor devices upon carrier substrates in this manner.

"Flip-chip" technology, one example of which is termed controlled collapse chip connection (C-4) technology, is an example of a packaging and assembly technology that results in a semiconductor device being oriented substantially parallel to a carrier substrate, such as a circuit board. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which, when an array of discrete conductive elements is located over the major surface, is referred to in the art as a "ball grid array" (BGA) package, typically includes a semiconductor die and a substrate, which is typically termed an "interposer."

When the interposer of a ball grid array package is positioned adjacent the front surface of the semiconductor die thereof, the bond pads of the semiconductor die on one side of the interposer may be electrically connected to corresponding contact areas on a surface of the opposite side of the interposer by way of intermediate conductive elements, such as bond wires, that extend through one or more holes formed in the interposer. The contact areas communicate through conductive traces with corresponding contact pads bearing discrete conductive elements. In this type of flip-chip semiconductor device assembly, the contact pads are located on the same side of the interposer as the contact pads. This type of flip-chip assembly is positioned adjacent a carrier substrate by orienting the interposer with the contact pad-bearing side thereof facing the carrier substrate.

The contact pads of the interposer are disposed in an array that has a footprint that mirrors an arrangement of corresponding terminals formed on a carrier substrate. Each of the bond (on bare flip-chip semiconductor dice) or contact (on flip-chip packages) pads and its corresponding terminal [as the contacts pads] may be electrically connected to one another by way of a conductive structure in the form of a discrete conductive element, such as a solder ball, that also spaces the interposer some distance away from the carrier substrate. The space between the interposer and the carrier substrate may be left open or filled with a so-called dielectric "underfill" material that provides electrical insulation between the semiconductor device and the carrier substrate and enhances the mechanical connection between the two components.

In addition, the intermediate conductive elements that connect the bond pads of the semiconductor die to their corresponding contact areas on the substrate may be encapsulated by introducing material into the opening or openings of the interposer from above the contact pad-bearing side thereof "Glob-top" type encapsulant materials, such as silicones or epoxies, are typically used for this purpose. Typically, glob-top encapsulant materials have a relatively high viscosity so that the material may be applied to a substantially planar surface without being laterally confined over a particular area of that surface. In comparison with lower viscosity molding materials, such as transfer molding compounds, which are typically used with some structure to laterally confine the molding material over a specific region of an interposer, the height of the resulting glob-top-encapsulated structure may be greater at or near a centerline of the interposer opening than the encapsulant material thickness that would otherwise be required to properly encapsulate the wire bonds or other intermediate conductive elements that extend over regions of the surface of an interposer that are located adjacent a periphery of an opening formed therethrough. As a result, the overall height of a glop-top encapsulating structure may be undesirably high, providing an undesirably thick semiconductor device package.

Accordingly, there is a need for a method for encapsulating connections between an interposer and semiconductor die of a semiconductor device assembly that facilitates leak-free introduction of encapsulant from the backside of the semiconductor die and a resulting semiconductor device assembly.

SUMMARY OF THE INVENTION

The present invention includes a semiconductor device assembly packaging method and semiconductor devices packaged in accordance with the method.

A packaging method incorporating teachings of the present invention includes assembling a semiconductor die with a substrate element, such as an interposer or a carrier substrate, by disposing a two-sided adhesive tape or other substantially planar member with adhesive on at least portions of both surfaces thereof between the active surface of the semiconductor die and the backside of the substrate element. Bond pads of the semiconductor die are exposed through a slot formed in the tape, as well as through an opening formed through the substrate element and aligned with the slot. At least one end and, preferably, both ends of the slot formed through the tape extend beyond an outer periphery of the semiconductor die. It is preferred, however, that neither end of the slot extends beyond an outer periphery of the substrate element with which the semiconductor die is assembled.

Wire bonds or other suitable intermediate conductive elements (e.g., tape-automated bonds (TABs) or thermocompression bonds) may be formed between the bond pads of the semiconductor die and the corresponding contacts of the substrate element. Of course, these intermediate conductive elements extend through the slot of the tape and the opening of the substrate element.

A coverlay, such as a tape or other substantially planar member having a single side thereof coated with adhesive material, may be disposed over the exposed surface of the substrate element opposite the semiconductor die so as to cover the intermediate conductive elements extending through the substrate element. The coverlay preferably substantially seals the outer substrate element side of the opening formed by the slots of the substrate element and the tape. Thus, the intermediate conductive elements are substantially contained by interior lateral edges of the substrate element and the tape, as well as by the semiconductor die and the coverlay, the only exception being that one or both ends of the slot formed through the tape may be exposed beyond the outer periphery of the semiconductor die. The coverlay may also include one or more recessed areas that are configured to receive the intermediate conductive elements without contacting any portion thereof.

Next, liquid or gel-like encapsulant material is introduced from above, with the coverlay at the bottom of the assembly, into the slot formed through the tape and the aligned opening formed through the substrate element. The encapsulant material is preferably introduced into the slot through an end thereof that is exposed beyond an outer periphery of the semiconductor die. As encapsulant material fills the slot of the tape and the opening of the substrate element, air is displaced in the channel defined between the semiconductor die, the coverlay and the sides of the aligned tape slot and substrate element opening through another, opposite end of the slot, which is also exposed beyond an outer periphery of the semiconductor die.

Once the encapsulant material within the channel cures or otherwise becomes at least semisolid, the coverlay may be removed from the substrate element, or contact pads on the substrate element may be exposed through the coverlay and discrete conductive elements may be applied thereto or formed thereon. The packaged semiconductor device may then be tested and used, as known in the art.

Other features and advantages of the present invention will become apparent to those of skill in the art through consideration of the ensuing description, the accompanying drawings, and the appended claims.

BRIEF DESCRIPTION OF THE DRAWINGS

In the drawings, which illustrate exemplary embodiments for carrying out the invention:

FIG. 7 is a perspective view of a package resulting from the process depicted in FIGS. 1–6 when the coverlay depicted in FIG. 4 is used;

FIG. 7A is a perspective view of a package resulting from the process depicted in in FIGS. 1–6 when the coverlay depicted in FIG. 4A is used;

FIG. 7B is a perspective view of a package resulting from the process depicted in FIGS. 1–6 when the substrate element and coverlay depicted in FIG. 4B are used;

DETAILED DESCRIPTION OF THE INVENTION

Figure 1:
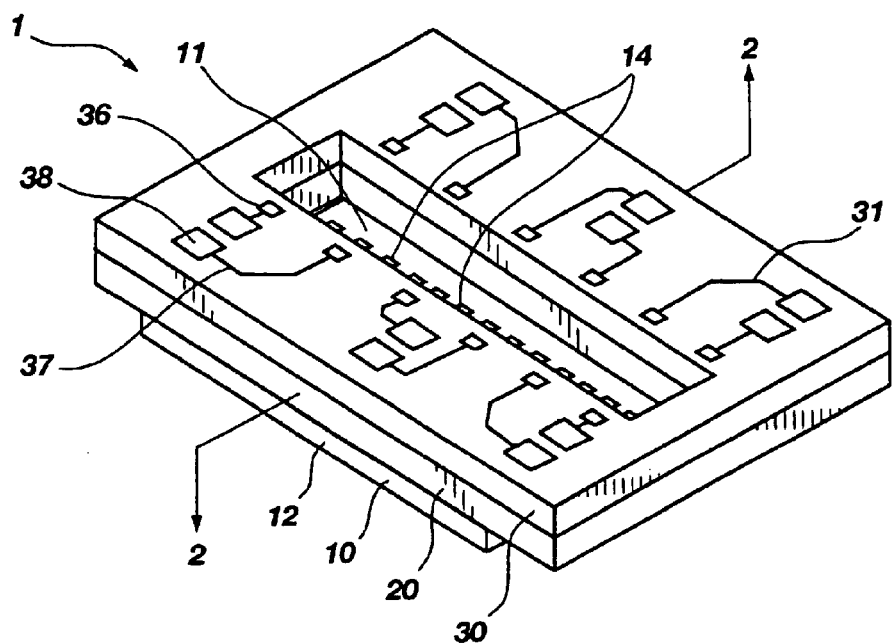
FIG. 1 is a perspective view of an assembly including a semiconductor die, a two-sided adhesive tape positioned on and secured to an active surface of the semiconductor die with bond pads of the semiconductor die being exposed through a slot in the tape, and a substrate element secured to an opposite side of the tape from the semiconductor die, the slot of the tape and the bond pads of the semiconductor die being exposed through an aligned opening in the substrate element.
Figure 1A:
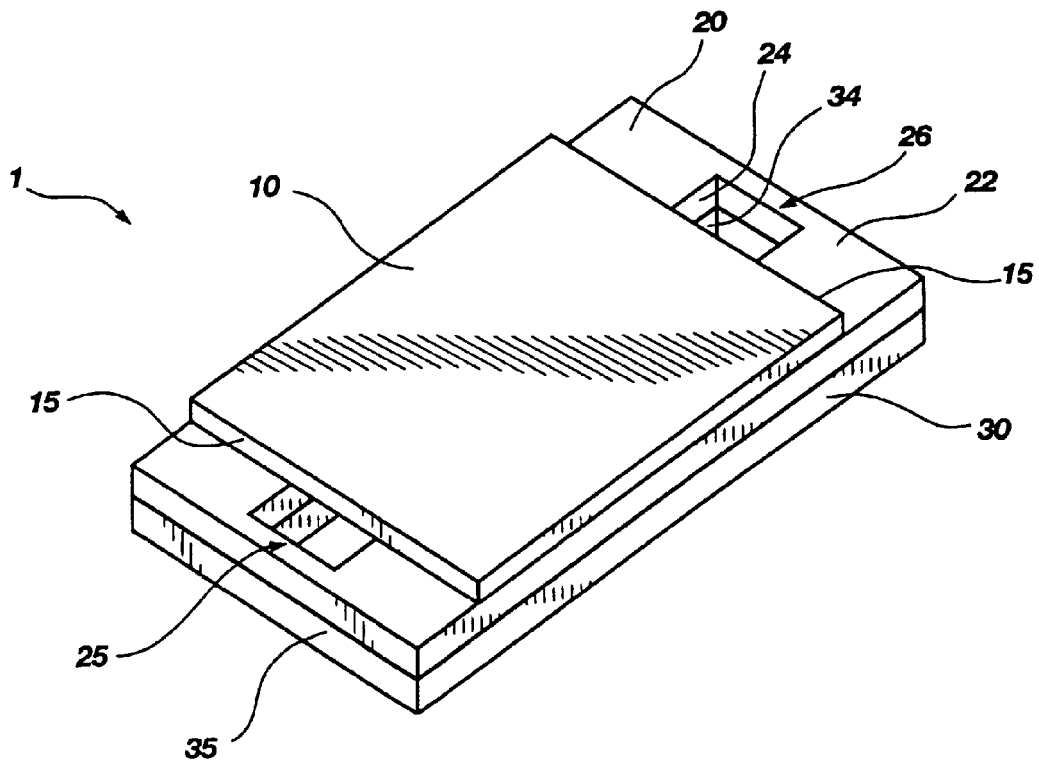
FIG. 1A is an inverted perspective view of the assembly shown in FIG. 1.
Figure 2:
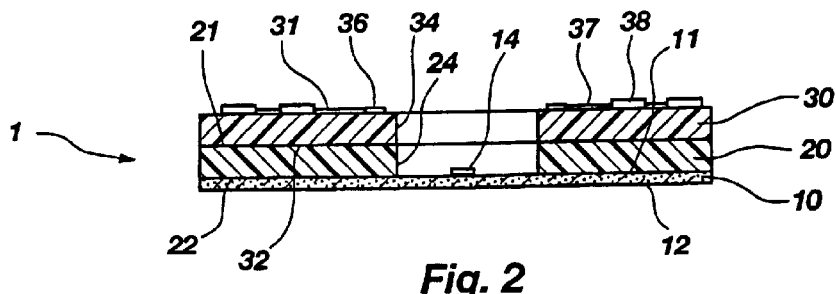
FIG. 2 is a cross-section taken along line 2—2 of FIG. 1, illustrating the bond pads of the semiconductor die, the slot formed through the tape, and the aligned opening in the substrate element through which the bond pads of the semiconductor die are exposed.

Referring to FIGS. 1, 1A, and 2, an assembly 1 is illustrated that includes a semiconductor die 10, a substrate element 30, and a dielectric tape 20 positioned between semiconductor die 10 and substrate element 30.

Semiconductor die 10 includes an active surface 11 and an opposite backside 12. Bond pads 14, which facilitate the communication of electrical signals to and from the various integrated circuits of semiconductor die 10, are carried upon active surface 11. While FIG. 1 illustrates bond pads 14 as being arranged substantially linearly along the center of active surface 11 in a pattern that is typically used to assemble a semiconductor die 10 with a leads-over-chip (LOC) type lead frame, methods incorporating teachings of the present invention are equally applicable to packaging semiconductor dice with different bond pad arrangements.

Tape 20 is a substantially planar member with two surfaces 21 and 22 that are preferably at least partially coated with adhesive material. Tape 20 also includes a slot 24 formed therethrough, which includes two closed ends. Slot 24 is located such that bond pads 14 of semiconductor die 10 are exposed therethrough when tape 20 is properly aligned over and secured to active surface 11 of semiconductor die 10.

The material from which tape 20 is formed preferably exhibits a similar coefficient of thermal expansion (CTE) to that of the material of semiconductor die 10. For example, a polyimide tape 20 would be useful with a semiconductor die 10 formed on a silicon substrate element. When semiconductor die 10 and tape 20 have substantially similar, or "matched," coefficients of thermal expansion, the likelihood that these elements of a package will be mechanically stressed during thermal cycling occurring in testing or operation of semiconductor die 10 is reduced.

As shown, substrate element 30 is an interposer with opposed surfaces 31 and 32. The dimensions of surfaces 31 and 32 of substrate element 30 may be substantially the same as the corresponding dimensions of surfaces 21 and 22 of tape 20. An opening 34 formed through substrate element 30 aligns with bond pads 14 of semiconductor die 10 through slot 24 such that bond pads 14 are exposed through opening 34 when substrate element 30 is properly positioned over active surface 11 of semiconductor die 10. Preferably, opening 34 is substantially the same size and shape as slot 24 of tape 20 and is aligned therewith upon securing tape 20 to a surface 32 of substrate element 30.

Substrate element 30 also includes contact areas 36 on surface 31 thereof. Each contact area 36 corresponds to a bond pad 14 of semiconductor die 10. In addition, surface 31 of the illustrated substrate element 30 carries contact pads 38, each of which corresponds to a contact area 36 and communicates therewith by way of a conductive element 37 that extends between contact pad 38 and contact area 36.

The material from which substrate element 30 is formed preferably has a coefficient of thermal expansion that is similar to or substantially the same as those of the materials of tape 20 and semiconductor die 10. For example, a substrate element 30 formed from silicon would have a similar coefficient of thermal expansion to those of a polyimide tape 20 and a silicon semiconductor die 10. Alternatively, other materials that may be used to fabricate flexible or rigid substrate elements, such as ceramics, FR-4 resin, or polyimide, may be used to form substrate element 30.

While the drawings depict substrate element 30 as being an interposer, the method of the present invention may also be used to package assemblies with other types of substrate elements, including, without limitation, other carrier substrate elements.

In forming assembly 1, tape 20 may be positioned relative to and secured to both active surface 11 of semiconductor die 10 and surface 32 of substrate element 30. When semiconductor die 10, tape 20, and substrate element 30 are properly positioned relative to one another, bond pads 14 of semiconductor die 10 are exposed through both slot 24 of tape 20 and aligned opening 34 of substrate element 30.

As shown in FIG. 1A, ends 25 and 26 of slot 24 formed through tape 20 and corresponding ends of opening 34 may extend beyond an outer periphery 15 of semiconductor die 10. Preferably, however, neither end 25, 26 of slot 24 extends beyond an outer periphery 35 of substrate element 30.

Figure 3:
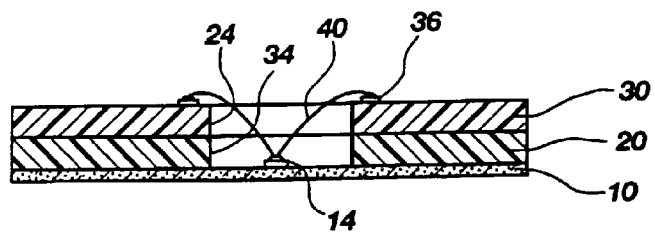
FIG. 3 is a cross-sectional representation of the assembly shown in FIG. 2, depicting the placement of intermediate conductive elements between the bond pads of the semiconductor die and corresponding contact areas or contact pads on the exposed surface of the substrate element.

Once semiconductor die 10, tape 20, and substrate element 30 have been properly positioned relative to one another and secured to one another to form assembly 1, each bond pad 14 of semiconductor die 10 may be electrically connected to its corresponding contact area 36 of substrate element 30. As shown in FIG. 3, this may be done by placing or forming an intermediate conductive element 40, such as the illustrated wire bond or a tape-automated bond (i.e., flex circuit) or thermocompression bond, between each bond pad 14 and its corresponding contact area 36, through slot 24 of tape 20 and opening 34 of substrate element 30, and by bonding respective ends of intermediate conductive element 40 to bond pad 14 and to contact area 36, as known in the art.

Since slot 24 and opening 34 extend beyond outer periphery 15 of semiconductor die 10, as shown in FIG. 1A, apparatus that form or position intermediate conductive elements 40, such as a wire bonding capillary, may better access bond pads 14 located at or near outer periphery 15.

Figure 4:
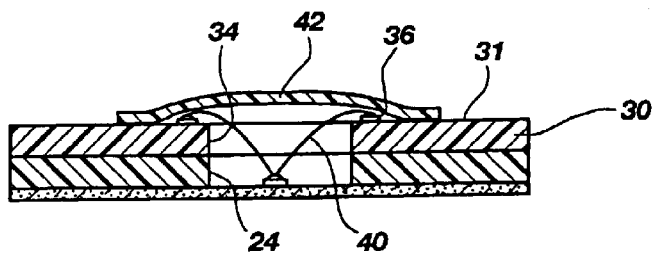
FIG. 4 is a cross-sectional representation of the assembly of FIG. 3, illustrating the positioning of a coverlay over at least a portion of an exposed surface of the substrate element to cover and at least partially contain the intermediate conductive elements that extend between the bond pads of the semiconductor die and their corresponding contact areas or pads of the substrate element.

Turning now to FIG. 4, a coverlay 42, which may comprise tape or another substantially planar member, one side of which is coated with adhesive material, is positioned on surface 31 of substrate element 30. While coverlay 42 may cover substantially the entire surface 31, coverlay need only substantially cover opening 34 and intermediate conductive elements 40 that extend through opening 34. Coverlay 42 may be aligned with surface 31 by known processes and secured thereto, as known in the art. The adhesive material of coverlay 42 preferably facilitates the ready removal of coverlay 42 from surface 31 once coverlay 42 is no longer needed. By way of example, a pressure sensitive adhesive that will withstand the conditions of subsequent processes may be used on coverlay 42. Coverlay 42 preferably has sufficient flexibility to conform to any irregularities or nonplanarities of surface 31 of substrate element 30, such as the portions of intermediate conductive elements 40 that extend over surface 31 and contact areas 36 located on surface 31.

Once coverlay 42 has been secured to surface 31 of substrate element 30 and over opening 34 thereof, intermediate conductive elements 40 are at least partially laterally contained within a receptacle formed by coverlay 42, the peripheral edges of opening 34, and the peripheral edges of slot 24 formed through tape 20. At the side of opening 34 opposite tape 20, intermediate conductive elements 40 are contained by coverlay 42. In addition, with the exception of the exposed ends 25, 26 (FIG. 1A) of slot 24 that are located outside the periphery 15 of semiconductor device 10, intermediate conductive elements 40 are also partially contained by semiconductor device 10.

Figure 4A:
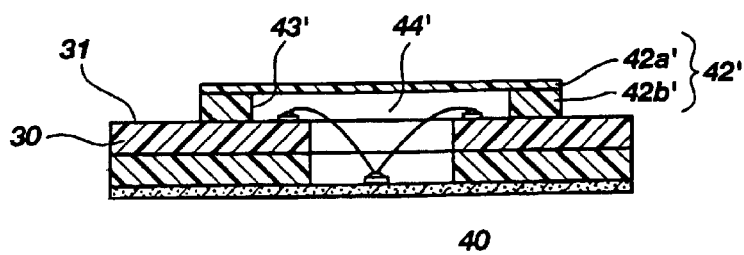
FIG. 4A is a cross-sectional representation of the assembly in FIG. 3, illustrating the positioning of a variation of a coverlay, which includes a recessed area, over at least a portion of the exposed surface of the substrate element to cover and at least partially containing the intermediate conductive elements.

As depicted in FIG. 4, coverlay 42 includes a single, substantially planar layer of material. Alternatively, as shown in FIG. 4A, a variation of coverlay 42' includes two layers 42a' and 42b', one layer 42a' of which is substantially continuous, while the other layer 42b' includes an aperture 43' therethrough. When layers 42a' and 42b'are secured to one another, aperture 43' forms a recess 44' within a surface of coverlay 42'. Aperture 43' and recess 44' formed thereby are located to receive the portions of intermediate conductive elements 40 that extend over surface 31 of substrate element 30 upon placement of coverlay 42' on surface 31. Preferably, when coverlay 42' is secured to surface 31, coverlay 42' does not contact any portion of intermediate conductive elements 40, thereby subsequently facilitating the substantially complete encapsulation of intermediate conductive elements 40.

Figure 4B:
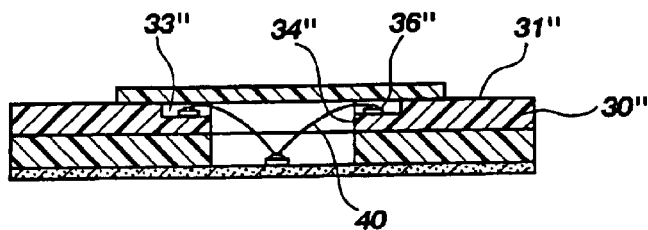
FIG. 4B is a cross-sectional representation of an assembly similar to that depicted in FIG. 3, but including a variation of the substrate element which includes a recessed area around the opening of the substrate element, and also including a coverlay over at least a portion of the exposed surface of the substrate element to cover and at least partially contain the intermediate conductive elements.

Alternative means by which intermediate conductive elements 40 may be substantially contained and subsequently encapsulated are shown in FIG. 4B, which illustrates a variation of a substrate element 30" that may be used in methods and semiconductor device packages incorporating teachings of the present invention. A surface 31" of substrate element 30" may include a recessed area 33" which surrounds opening 34". Recessed area 33", within which contact areas 36" are located, is configured to receive the portions of intermediate conductive elements 40 that extend over surface 31". Accordingly, a substantially planar coverlay 42, such as that described in reference to FIG. 4, may be secured to surface 31" of substrate element 30" without substantially contacting intermediate conductive elements 40.

Figure 5:
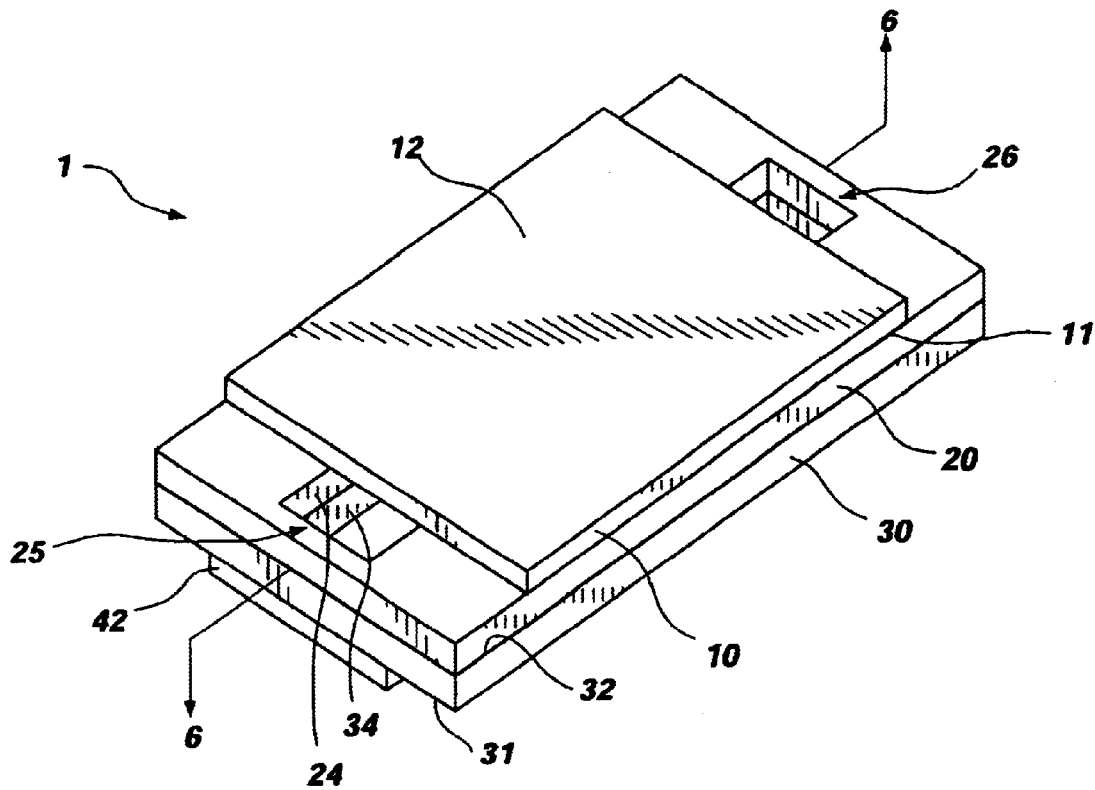
FIG. 5 is an inverted perspective view of the assembly of FIG. 4, schematically depicting the production of encapsulant material into the slot formed through the tape and the aligned opening through the substrate element from above with the backside of the semiconductor die facing upward.
Figure 6:
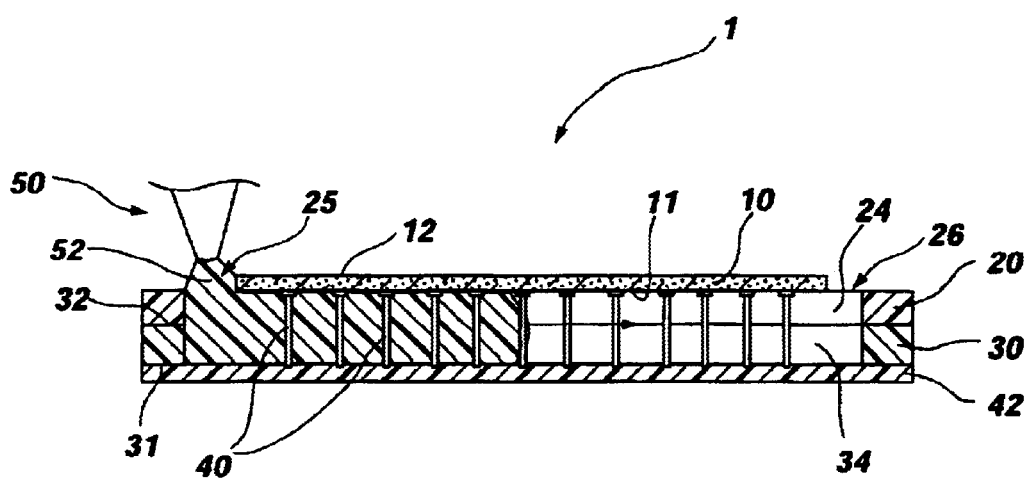
FIG. 6 is a cross-section taken along line 6—6 of FIG. 5, showing the flow of encapsulant material into the slot formed through the tape and the aligned opening through the substrate element and around the intermediate conductive elements therein.

FIGS. 5 and 6 show assembly 1 in an inverted orientation, with backside 12 of semiconductor die 10 and the exposed ends 25, 26 of slot 24 formed through tape 20 facing upward. Using an encapsulant dispenser needle 50 of a type known in the art, a suitable, known type of dielectric encapsulant material 52 may be introduced into slot 24 of tape 20 and opening 34 of substrate element 30 through an exposed end 25 of slot 24. As encapsulant material 52 is being introduced into slot 24, air within slot 24 is displaced through the other end 26 thereof. In addition to containing encapsulant material 52 within slot 24 and opening 34, coverlay 42 also laterally confines encapsulant material 52 over surface 31 of substrate element 30. Preferably, when slot 24 and opening 34 are substantially filled with encapsulant material 52, encapsulant material 52 substantially encapsulates intermediate conductive elements 40.

Once slot 24 and opening 34 are substantially completely filled with encapsulant material 52, encapsulant material 52 may be permitted to harden, if a thermoplastic resin, or known processes may be employed to cure or set other types of encapsulant materials 52 (e.g., by application of heat and/or pressure to thermoset resins, by exposure of photo-imageable polymer encapsulant materials to an appropriate wavelength of radiation, or by use of an appropriate catalyst for other types of materials). Together, encapsulant material 52 and tape 20 substantially encapsulate active surface 11 of semiconductor device 10 and fill the gap between active surface 11 and surface 32 of substrate element 30.

Once encapsulant material 52 has hardened, all or a portion of coverlay 42, 42' may be removed from substrate element 30, 30" so as to expose at least contact pads 38, 38', 38" thereof, as depicted in FIGS. 7, 7A, and 7B, and form an operable semiconductor device package 2, 2', 2".

Figure 8A:
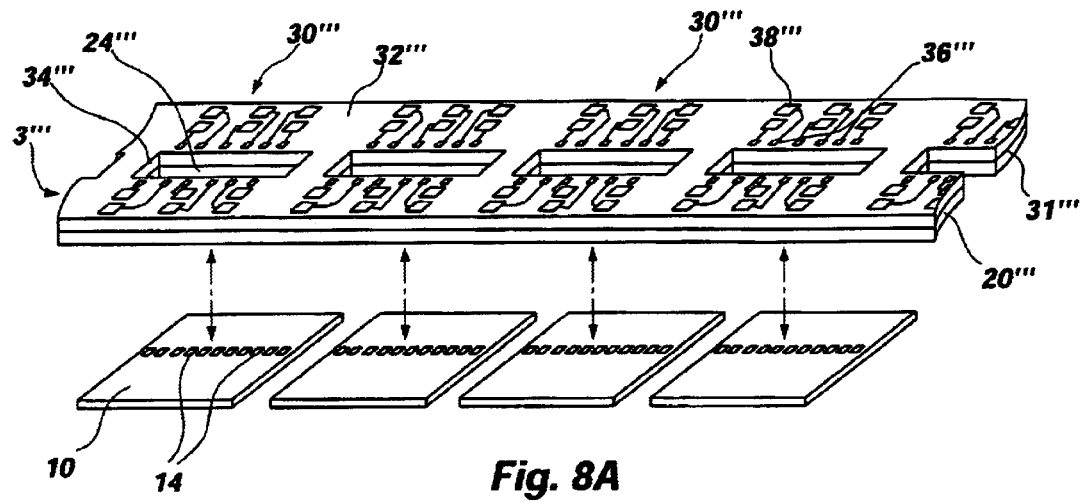
FIG. 8A is a perspective assembly view of a substrate element strip with tape secured to the backside thereof and of semiconductor dice to be assembled with the substrate element strip.
Figure 8B:
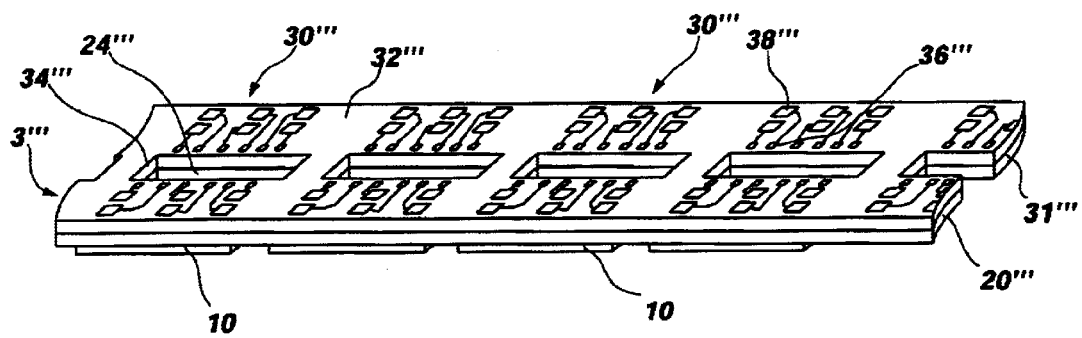
FIG. 8B is a perspective view of an assembly including each of the elements shown in FIG. 8A.

An alternative method for packaging semiconductor dice 10 in accordance with teachings of the present invention, which involves the use of substrate element strips 3''', each of which includes a plurality of connected substrate elements 30''' formed thereon, is shown in FIGS. 8A and 8B.

As shown in FIG. 8A, each substrate element 30''' of substrate element strip 3''' includes an elongate opening 34''' formed therethrough, as well as contact areas 36''' positioned on a surface 32''' of substrate element 30''', proximate its opening 34''' and contact pads 38''' corresponding to and in communication with contact areas 36'''.

An elongate tape 20''', which includes a plurality of slots 24''' formed therethrough, each slot 24''' corresponding to an opening 34''' of a substrate element 30''' of substrate element strip 3''', may be positioned adjacent and secured to a backside 31''' of substrate element strip 3'''.

A semiconductor die 10 may be aligned with each substrate element 30''' formed on substrate element strip 3''', as shown in FIG. 8A, and secured to substrate element 30''' by way of tape 20''', as illustrated in FIG. 8B. When semiconductor dice 10 are properly positioned, upon securing semiconductor dice 10 to tape 20''' and, thus, to substrate element strip 3''', bond pads 14 on each semiconductor die 10 are exposed through their corresponding slot 24''' of tape 20''', as well as through their corresponding opening 34''' of the corresponding substrate element 30'''.

Figure 8C:
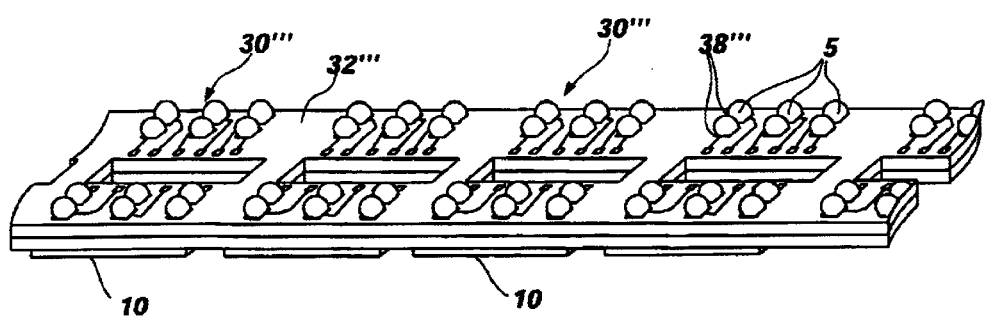
FIG. 8C is a perspective view of the assembly of FIG. 8B, depicting discrete conductive elements being secured to contact pads of the substrate element.
Figure 3:
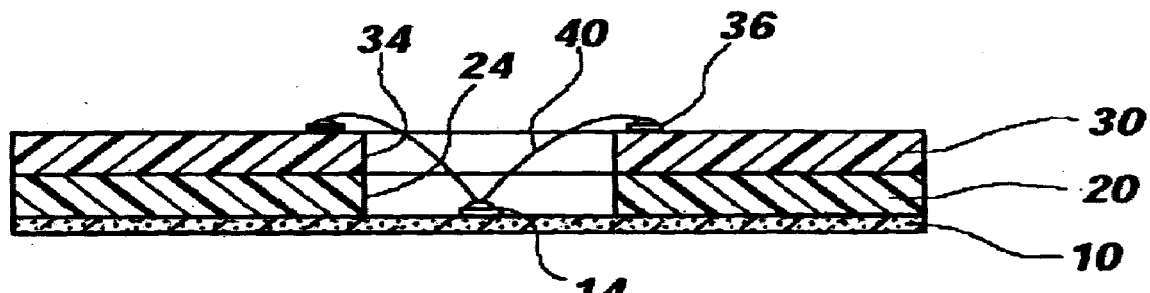
Figure 4:
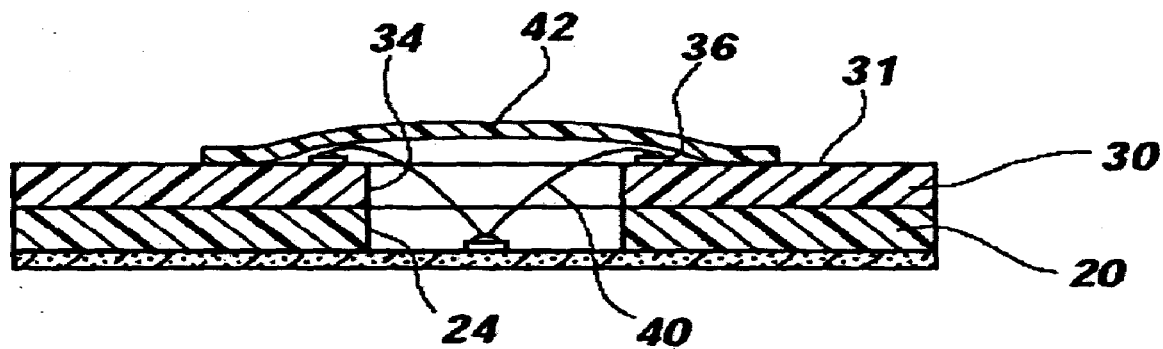
Figure 4A:
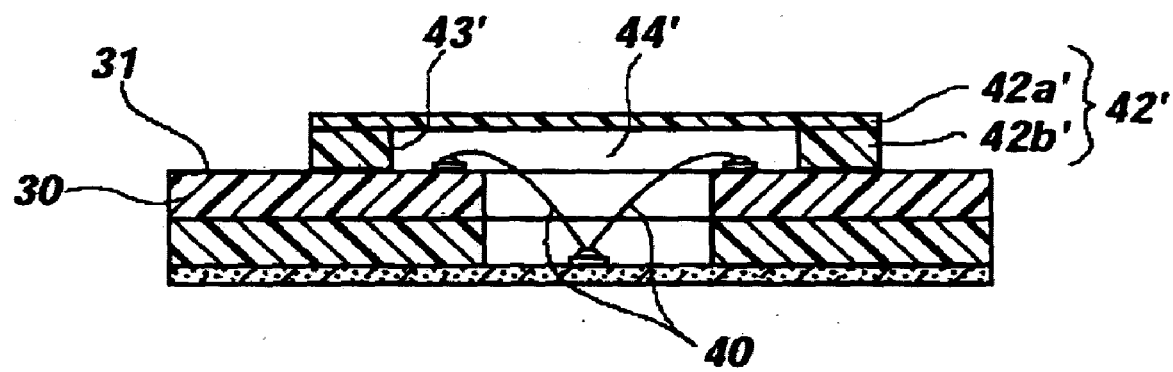
Figure 3:
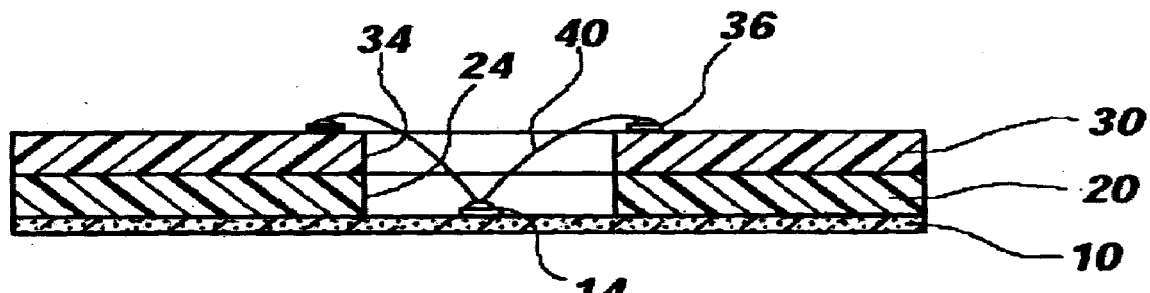
Figure 4:
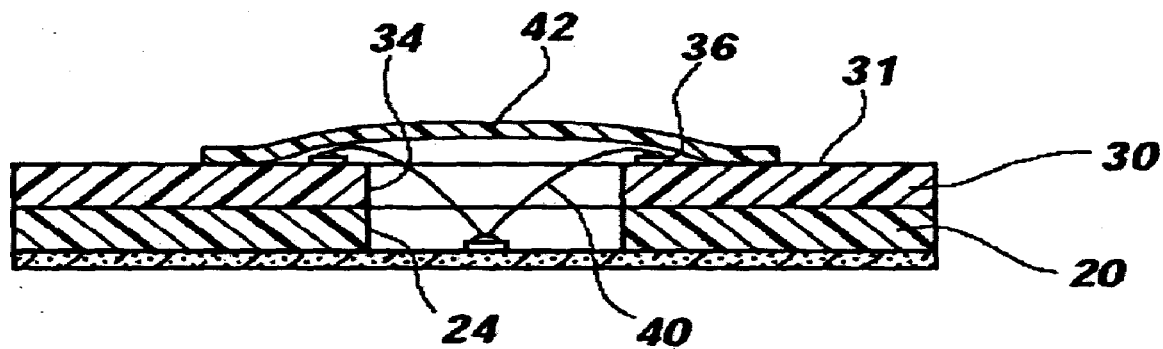
Figure 4A:
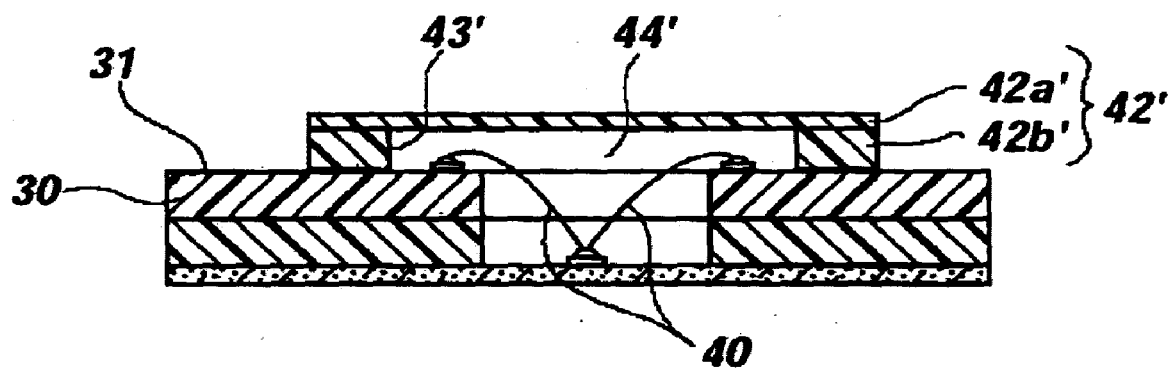

In addition, as depicted in FIG. 8C, discrete conductive elements 5 may be formed on or secured to contact pads 38''' on surface 32''' of each substrate element 30''' to facilitate connection of each substrate element 30''' to a higher level substrate, such as a circuit board, or to another semiconductor device, as known in the art. Discrete conductive elements 5 may comprise, for example, balls, bumps, pillars, columns, or other structures formed from one or more metals (e.g., solder, gold, etc.), conductive epoxies, conductor-filled epoxies, or z-axis conductive elastomers.

Once each semiconductor die 10 and its corresponding substrate element 30''' have been electrically connected to each other and packaged, such as by the processes disclosed herein in reference to FIGS. 3–6, adjacent packages may be severed or otherwise separated from one another by known techniques, such as by use of a wafer saw or otherwise, as known in the art.

In the illustrated embodiments of the inventive semiconductor device package, tape 20 comprises the majority of material between semiconductor die 10 and substrate element 30, while encapsulant material 52 covers a relatively small portion of active surface 11 of semiconductor die 10. If, as is preferred, the coefficient of thermal expansion of tape 20 is substantially the same as or similar enough to the coefficient of thermal expansion of semiconductor die 10, the thermally induced mechanical stresses (i.e., by adjacent, thermally mismatched layers or structures) that will be applied to a package during operation of semiconductor die 10 will be minimized. If substrate element 30 is also formed from silicon or another material having substantially the same or a similar enough coefficient of thermal expansion to that of semiconductor die 10, thermally induced mechanical stresses on package 2, 2', 2" will be further minimized.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor device package, comprising:
   a semiconductor die with a plurality of bond pads arranged on an active surface thereof;

a tape positioned over the active surface, the tape including at least one slot formed therethrough, each of the plurality of bond pads being exposed through the at least one slot, at least one end of the at least one slot extending beyond an outer periphery of the semiconductor die;

a substrate element positioned over the tape opposite the semiconductor die, the substrate element including a plurality of contact areas, each contact area of the plurality corresponding to a bond pad of the plurality of bond pads and electrically connected thereto by way of an intermediate conductive element that extends through at least one opening formed through the substrate element and aligned with the at the least one slot of the tape, the substrate element further including a contact pad in communication with each contact area of the plurality of contact areas by way of a substantially laterally extending conductive trace;

a quantity of encapsulant material substantially filling a volume defined by the at least one slot of the tape and the at least one opening of the substrate element; and a coverlay secured to a surface of the substrate element opposite the tape, the coverlay substantially covering at least the at least one opening through the substrate element, contact pads of the substrate element being exposed beyond or through the coverlay.

2. The semiconductor device package of claim 1, wherein the plurality of bond pads is arranged substantially linearly along a central region of the active surface of the semiconductor die.

3. The semiconductor device package of claim 1, wherein the tape is formed from a material having a coefficient of thermal expansion similar to a coefficient of thermal expansion of a material of the semiconductor die.

4. The semiconductor device package of claim 3, wherein the substrate element has a coefficient of thermal expansion similar to the coefficient of thermal expansion of the material of the semiconductor die.

5. The semiconductor device package of claim 1, wherein both ends of the at least one slot formed through the tape extend beyond the outer periphery of the semiconductor die.

6. The semiconductor device package of claim 1, wherein the tape is adhesively secured to the active surface of the semiconductor die and to the substrate element.

7. The semiconductor device package of claim 1, wherein the substrate element comprises at least one of an interposer and a carrier substrate.

8. The semiconductor device package of claim 1, wherein the substrate element comprises silicon.

9. The semiconductor device package of claim 1, wherein the quantity of encapsulant material substantially encapsulates each intermediate conductive element.

10. The semiconductor device package of claim 9, wherein the quantity of encapsulant material protrudes above a major plane of an exposed surface of the substrate element opposite the semiconductor die.

11. The semiconductor device package of claim 1, wherein the substrate element includes a recessed area adjacent the at least one opening, each contact area of the plurality of contact areas being located within the recessed area.

12. The semiconductor device package of claim 11, wherein the quantity of encapsulant-material substantially fills the recessed area.

13. The semiconductor device package of claim 12, wherein the quantity of encapsulant material substantially encapsulates each intermediate conductive element.

14. The semiconductor device package of claim 12, wherein the quantity of encapsulant material does not extend substantially beyond a major plane of an exposed surface of the substrate element.

15. The semiconductor device package of claim 1, wherein the coverlay comprises a recessed area within which each intermediate conductive element is contained.

16. The semiconductor device package of claim 1, wherein the coverlay is secured to the substrate element with an adhesive material.

17. The semiconductor device package of claim 16, wherein the adhesive material comprises a pressure sensitive adhesive material.

18. The semiconductor device package of claim 1, further comprising discrete conductive elements protruding from at least some of the contact pads.

19. A semiconductor device assembly, comprising:

a semiconductor die with at least one bond pad on an active surface thereof;

a tape secured to the active surface, the tape including a slot formed therethrough with the at least one bond pad being exposed through the slot, at least one end of the slot extending beyond an outer periphery of the semiconductor die;

a substrate element positioned over the semiconductor die opposite the tape from the semiconductor die, the substrate element including at least one opening formed therethrough through which the at least one bond pad is exposed; and a coverlay adhesively secured to a surface of the substrate element opposite the tape, the coverlay substantially covering at least the at least one opening through the substrate element.

20. The assembly of claim 19, wherein the semiconductor die includes a plurality of bond pads arranged substantially linearly along a central region of the active surface.

21. The assembly of claim 19, wherein the tape has a similar coefficient of thermal expansion to a coefficient of thermal expansion of the substrate element.

22. The assembly of claim 21, wherein the semiconductor die has a similar coefficient of thermal expansion to the coefficient of thermal expansion of the substrate element.

23. The assembly of claim 19, wherein two ends of the slot extend beyond the outer periphery of the semiconductor die.

24. The assembly of claim 23, wherein one of the two ends of the slot is positioned so as to facilitate displacement of air from the slot while an encapsulant material is being introduced at least into a volume defined by the slot from the other of the two ends.

25. The assembly of claim 19, wherein the at least one end of the slot receives encapsulant material.

26. The assembly of claim 19, wherein the substrate element comprises at least one of an interposer and a carrier substrate.

27. The assembly of claim 19, wherein the substrate element includes a recessed area formed adjacent the at least one opening in a surface of the substrate element located opposite the tape.

28. The assembly of claim 27, wherein the substrate element includes at least one contact area corresponding to the at least one bond pad of the semiconductor die.

29. The assembly of claim 28, wherein the at least one contact area is located within the recessed area.

30. The assembly of claim 29, wherein the recessed area receives a portion of an intermediate conductive element that extends between the at least one bond pad and the at least one contact area.

31. The assembly of claim 19, wherein the substrate element includes at least one contact area that corresponds to the at least one bond pad of the semiconductor die and at least one contact pad in electrical communication with the at least one contact area.

32. The assembly of claim 31, further comprising at least one intermediate conductive element electrically connecting the at least one bond pad to the at least one contact area.

33. The assembly of claim 32, wherein the at least one intermediate conductive element extends through the slot of the tape and the at least one opening of the substrate element.

34. The assembly of claim 19, wherein the coverlay includes a recessed area configured to communicate with the at least one opening.

35. The assembly of claim 34, wherein the recessed area is configured to receive a portion of at least one intermediate conductive element electrically connecting the at least one bond pad of the semiconductor die to a contact area on a surface of the substrate element adjacent the at least one opening formed therethrough.

36. The assembly of claim 19, wherein the coverlay, the at least one opening formed through the substrate element, the slot formed through the tape, and the semiconductor die together form a receptacle.

37. The assembly of claim 36, wherein the receptacle at least partially contains a quantity of encapsulant material.

38. The assembly of claim 19, wherein the coverlay is secured to the surface of the substrate element with an adhesive material.

39. The assembly of claim 38, wherein the adhesive material comprises a pressure sensitive adhesive material.

40. The assembly of claim 19, wherein the coverlay is removably secured to the surface of the substrate element.

41. A method for packaging at least an active surface of a semiconductor die, comprising:
   positioning a tape over the active surface so that at least one bond pad on the active surface is exposed through a slot formed through the tape and at least one end of the slot extends beyond an outer periphery of the semiconductor die;
   positioning a substrate element over the tape so that the at least one bond pad is exposed through at least one opening formed through the substrate element and aligned with the slot, the substrate element including at least one contact area corresponding to the at least one bond pad;
   electrically connecting the at least one bond pad to the at least one contact area;
   adhesively securing a coverlay to an exposed surface of the substrate element to substantially cover the at least one opening formed through the substrate element; and
   introducing encapsulant material through the at least one end into a receptacle formed by the coverlay, the at least one opening, the slot, and the semiconductor die from a location opposite the semiconductor die from the tape.

42. The method of claim 41, wherein positioning the tape comprises positioning over the semiconductor die a tape having a similar coefficient of thermal expansion to a coefficient of thermal expansion of the semiconductor die.

43. The method of claim 42, wherein sad positioning the substrate element comprises positioning over the tape a substrate element having a similar coefficient of thermal expansion to the coefficient of thermal expansion of the semiconductor die.

44. The method of claim 43, wherein positioning the substrate element comprises positioning a substrate element comprising silicon over the tape.

45. The method of claim 41, wherein said positioning the tape comprises orienting the slot with another end thereof extending laterally beyond the outer periphery of the semiconductor die.

46. The method of claim 41, further including securing the tape to the active surface of the semiconductor die.

47. The method of claim 46, wherein securing comprises adhering the tape to the active surface.

48. The method of claim 41, wherein positioning the substrate element comprises positioning at least one of an interposer and a carrier substrate over the tape.

49. The method of claim 41, wherein positioning the substrate element comprises positioning over the tape a substrate element comprising a recessed area adjacent the at least one opening and including therein the at least one contact area.

50. The method of claim 49, wherein introducing comprises introducing a portion of the encapsulant material into the recessed area.

51. The method of claim 41, wherein electrically connecting comprises connecting at least one intermediate conductive element between the at least one bond pad and the at least one contact area.

52. The method of claim 51, wherein connecting the at least one intermediate conductive element comprises wire bonding.

53. The method of claim 51, wherein connecting the at least one intermediate conductive element comprises extending the at least one intermediate conductive clement through the slot formed through the tape and the at least one opening formed through the substrate element.

54. The method of claim 41, wherein adhesively securing the coverlay comprises positioning over the substrate element a coverlay including a recessed area alignable over the at least one opening and over intermediate conductive elements extending through the at least one opening.

55. The method of claim 41, further including securing the substrate element to the tape.

56. The method of claim 55, wherein securing comprises adhesively securing the substrate element to the tape.

57. The method of claim 41, wherein adhesively securing comprises securing the coverlay to the substrate element with a pressure sensitive adhesive.

58. The method of claim 57, wherein adhesively securing comprises removably securing the coverlay to the substrate element.

59. The method of claim 41, wherein introducing comprises substantially filling the slot formed through the tape and the at least one opening formed through the substrate element with the encapsulant material.

60. The method of claim 41, wherein introducing comprises substantially encapsulating at least one intermediate conductive element electrically connecting the at least one bond pad to the at least one contact area.

61. The method of claim 41, wherein adhesively securing the coverlay comprises forming the receptacle, including the slot and the at least one opening, within which the at least one bond pad is located.

62. A method for preparing a semiconductor die for packaging, comprising:
   positioning a tape over at least an active surface of the semiconductor die, the tape including a slot through which at least one bond pad on the active surface of the semiconductor die is exposed, at least a portion of the slot extending laterally beyond an outer periphery of the semiconductor die;
   positioning a substrate element over the tape with at least one opening formed through the substrate element being located at least partially over &the slot; and adhesively securing a coverlay to the substrate element to substantially seal the at least one opening, the coverlay and lateral edges of the at least one opening and the slot forming a receptacle.

63. The method of claim 62, further comprising electrically connecting the at least one bond pad to at least one contact area located on a surface of the substrate element opposite the tape, proximate the at least one opening.

64. The method of claim 63, wherein electrically connecting comprises connecting at least one intermediate conductive element between the at least one bond pad and the at least one contact area.

65. The method of claim 64, wherein connecting the at least one intermediate conductive element comprises positioning the at least one intermediate conductive element at least partially within the slot and the at least one opening.

66. The method of claim 63, wherein so positioning the substrate element comprises positioning over the tape a substrate element including a recessed area adjacent at least a portion of an edge of the at least one opening, the at least one contact area being located within the recessed area.

67. The method of claim 62, wherein sa positioning the tape comprises positioning a tape having a coefficient of thermal expansion similar to a coefficient of thermal expansion of the semiconductor die.

68. The method of claim 67, wherein positioning the substrate element comprises positioning over the tape a substrate element having a coefficient of thermal expansion similar to the coefficient of thermal expansion of the semiconductor die.

69. The method of claim 62, wherein so positioning the tape comprises positioning the tape with at least two regions of the slot extending laterally beyond the outer periphery of the semiconductor die.

70. The method of claim 62, further comprising securing the tape to the active surface of the semiconductor die.

71. The method of claim 70, wherein securing comprises adhesively securing the tape to the active surface of the semiconductor die.

72. The method of claim 62, wherein positioning the substrate element comprises positioning over the tape a substrate element comprising at least one of an interposer and a carrier substrate.

73. The method of claim 62, further comprising securing the substrate element to the tape.

74. The method of claim 73, wherein securing comprises adhesively securing the substrate element to the tape.

75. The method of claim 62, wherein adhesively securing the coverlay comprises positioning over the substrate element a coverlay comprising a recess formed therein, the recess being positioned so as to communicate with the at least one opening formed through the substrate element when positioning is effected.

76. The method of claim 62, wherein adhesively securing comprises adhesively securing the coverlay to the substrate element with a pressure sensitive adhesive.

77. The method of claim 62, wherein adhesively securing comprises removably securing the coverlay to the substrate element.

78. A semiconductor device package, comprising:
a semiconductor die with a plurality of bond pads arranged on an active surface thereof;
a tape positioned over the active surface, the tape including at least one slot formed therethrough, each of the plurality of bond pads being exposed through the at least one slot, at least one end of the at least one slot extending beyond an outer periphery of the semiconductor die;
a substrate element positioned over the tape opposite the semiconductor die, the substrate element including a plurality of contact areas, each contact area of the plurality corresponding to a bond pad of the plurality of bond pads and electrically connected thereto by way of an intermediate conductive element that extends through at least one opening formed through the substrate element and aligned with the at least one slot of the tape, the substrate element further including a contact pad in communication with each contact area of the plurality of contact areas by way of a substantially laterally extending conductive trace;
a quantity of encapsulant material substantially filling a volume defined by the at least one slot of the tape and the at least one opening of the substrate element; and
a coverlay positioned over a surface of the substrate element opposite the tape, the coverlay substantially covering at least the at least one opening through the substrate element, contact pads of the substrate element being exposed through or beyond the coverlay.

79. The semiconductor device package of claim 78, wherein the plurality of bond pads is arranged substantially linearly along a central region of the active surface of the semiconductor die.

80. The semiconductor device package of claim 78, wherein the tape is formed from a material having a coefficient of thermal expansion similar to a coefficient of thermal expansion of a material of the semiconductor die.

81. The semiconductor device package of claim 80, wherein the substrate element has a coefficient of thermal expansion similar to the coefficient of thermal expansion of the material of the semiconductor die.

82. The semiconductor device package of claim 78, wherein both ends of the at least one slot formed through the tape extend beyond the outer periphery of the semiconductor die.

83. The semiconductor device package of claim 78, wherein the tape is adhesively secured to the active surface of the semiconductor die and to the substrate element.

84. The semiconductor device package of claim 78, wherein the substrate element comprises at least one of an interposer and a carrier substrate.

85. The semiconductor device package of claim 78, wherein the substrate element comprises silicon.

86. The semiconductor device package of claim 78, wherein the quantity of encapsulant material substantially encapsulates each intermediate conductive element.

87. The semiconductor device package of claim 86, wherein s*the quantity of encapsulant material protrudes above a major plane of an exposed surface of the substrate element opposite the semiconductor die.

88. The semiconductor device package of claim 78, wherein the substrate element includes a recessed area adjacent the at least one opening, each contact area of the plurality of contact areas being located within the recessed area.

89. The semiconductor device package of claim 88, wherein the quantity of encapsulant material substantially fills the recessed area.

90. The semiconductor device package of claim 89, wherein the quantity of encapsulant material substantially encapsulates each intermediate conductive element.

91. The semiconductor device package of claim 89, wherein the quantity of encapsulant material does not extend substantially beyond a major plane of an exposed surface of the substrate element.

92. The semiconductor device package of claim 78, wherein the coverlay comprises a recessed area within which each intermediate conductive element is contained.

93. The semiconductor device package of claim 78, wherein the coverlay is secured to the surface of the substrate element.

94. The semiconductor device package of claim 93, wherein the coverlay is secured to the surface of the substrate element with an adhesive material.

95. The semiconductor device package of claim 94, wherein the adhesive material comprises a pressure sensitive adhesive material.

96. The semiconductor device package of claim 78, further comprising discrete conductive elements protruding from at least some of the contact pads.

97. A method for preparing a semiconductor die for packaging, comprising:

positioning a tape over at least an active surface of the semiconductor die, the tape including a slot through which at least one bond pad on the active surface of the semiconductor die is exposed, at least a portion of the slot extending laterally beyond an outer periphery of the semiconductor die;

positioning a substrate element over the tape with at least one opening formed through the substrate element being located at least partially over the slot; and positioning a coverlay over the substrate element to substantially seal the at least one opening, the coverlay and lateral edges of the at least one opening and the slot forming a receptacle, contact pads exposed to at a surface of the substrate element adjacent to which s % the coverlay is positioned being exposed through or beyond an outer periphery of the coverlay.

98. The method of claim 97, further comprising electrically connecting the at least one bond pad to at least one contact area located on a surface of the substrate element opposite the tape, proximate the at least one opening.

99. The method of claim 98, wherein so electrically connecting comprises connecting at least one intermediate conductive element between the at least one bond pad and the at least one contact area.

100. The method of claim 99, wherein connecting the at least one intermediate conductive element comprises positioning the at least one intermediate conductive element at least partially within the slot and the at least one opening.

101. The method of claim 98, wherein positioning the substrate element comprises positioning over the tape a substrate element including a recessed area adjacent at least a portion of an edge of the at least one opening, the at least one contact area being located within the recessed area.

102. The method of claim 97, wherein positioning the tape comprises positioning a tape having a coefficient of thermal expansion similar to a coefficient of thermal expansion of the semiconductor die.

103. The method of claim 102, wherein positioning the substrate element comprises positioning over the tape a substrate element having a coefficient of thermal expansion similar to the coefficient of thermal expansion of the semiconductor die.

104. The method of claim 97, wherein positioning the tape comprises positioning the tape with at least two regions of the slot extending laterally beyond the outer periphery of the semiconductor die.

105. The method of claim 97, further comprising securing the tape to the active surface of the semiconductor die.

106. The method of claim 105, wherein securing comprises adhesively securing the tape to the active surface of the semiconductor die.

107. The method of claim 97, wherein positioning the substrate element comprises positioning over the tape a substrate element comprising at least one of an interposer and a carrier substrate.

108. The method of claim 97, further comprising securing the substrate element to the tape.

109. The method of claim 108, wherein securing comprises adhesively securing the substrate element to the tape.

110. The method of claim 97, wherein so positioning the coverlay comprises positioning over the substrate clement a coverlay comprising a recess formed therein, the recess being positioned so as to communicate with the at least one opening formed through the substrate element when positioning is effected.

111. The method of claim 97, wherein so positioning the coverlay includes securing the coverlay to the substrate element.

112. The method of claim 111, wherein securing comprises removably securing the coverlay to so the substrate element.

113. The method of claim 111, wherein securing comprises removably securing the coverlay to the substrate element.

* * * * *

UNITED STATES PATENT AND TRADEMARK OFFICE
CERTIFICATE OF CORRECTION

PATENT NO.    : 6,781,248 B2
DATED         : August 24, 2004
INVENTOR(S)   : Chong Chin Hui, Lee Kian Chai and Jason Pittam It is certified that error appears in the above-identified patent and that said Letters Patent is hereby corrected as shown below:

Drawings,
Figure 3, switch reference numerals "24" and "34" (as shown on attached page).
Figure 4, add referance numeral -- 20 -- and appropriate lead line (as shown on attached page).
Figure 4A, insert two lead lines extending from "40" toward the depicted conductive elements (as shown on the attached page).

Column 2,
Lines 5-6, delete "[as the contacts pads]".
Line 21, change "thereof" to -- thereof. --.

Column 4,
Line 30, change "production" to -- introduction --.
Line 50, before "backside" change "the" to -- a --.

Column 11,
Line 60, delete "sad".

Column 12,
Line 1, delete "said".
Line 67, change "& the" to -- the --.

Column 13,
Lines 16 and 30, delete "so".
Line 21, delete "sa".

UNITED STATES PATENT AND TRADEMARK OFFICE
CERTIFICATE OF CORRECTION

PATENT NO. : 6,781,248 B2
DATED : August 24, 2004
INVENTOR(S) : Chong Chin Hui, Lee Kian Chai and Jason Pittam It is certified that error appears in the above-identified patent and that said Letters Patent is hereby corrected as shown below:

<u>Column 14,</u>
Line 47, change "s*the" to -- the --.

<u>Column 15,</u>
Line 27, delete "exposed to".
Line 28, delete "s %".
Line 35, delete "so".

<u>Column 16,</u>
Lines 29 and 35, delete "so".
Line 30, change "clement" to -- element --.

Signed and Sealed this

Sixth Day of June, 2006

JON W. DUDAS
*Director of the United States Patent and Trademark Office*

UNITED STATES PATENT AND TRADEMARK OFFICE
CERTIFICATE OF CORRECTION

PATENT NO. : 6,781,248 B2
APPLICATION NO. : 09/916197
DATED : August 24, 2004
INVENTOR(S) : Chong Chin Hui, Lee Kian Chai and Jason Pittam It is certified that error appears in the above-identified patent and that said Letters Patent is hereby corrected as shown below:

Drawings,
Figure 3, switch reference numerals "24" and "34" (as shown on attached page).
Figure 4, add reference numeral -- 20 -- and appropriate lead line (as shown on attached page).
Figure 4A, insert two lead lines extending from "40" toward the depicted conductive elements (as shown on the attached page).

Column 2,
Lines 5-6, delete "[as the contacts pads]".
Line 21, change "thereof" to -- thereof. --.

Column 4,
Line 30, change "production" to -- introduction --.
Line 50, before "backside" change "the" to -- a --.

Column 11,
Line 60, delete "sad".

Column 12,
Line 1, delete "said".
Line 67, change "& the" to -- the --.

Column 13,
Lines 16 and 30, delete "so".
Line 21, delete "sa".

UNITED STATES PATENT AND TRADEMARK OFFICE
CERTIFICATE OF CORRECTION

PATENT NO. : 6,781,248 B2
APPLICATION NO. : 09/916197
DATED : August 24, 2004
INVENTOR(S) : Chong Chin Hui, Lee Kian Chai and Jason Pittam It is certified that error appears in the above-identified patent and that said Letters Patent is hereby corrected as shown below:

<u>Column 14,</u>
Line 47, change "s*the" to -- the --.

<u>Column 15,</u>
Line 27, delete "exposed to".
Line 28, delete "s %".
Line 35, delete "so".

<u>Column 16,</u>
Lines 29 and 35, delete "so".
Line 30, change "clement" to -- element --.

This certificate supersedes Certificate of Correction issued June 6, 2006.

Signed and Sealed this

Sixteenth Day of October, 2007

JON W. DUDAS
*Director of the United States Patent and Trademark Office*